United States Patent [19]

Dunn et al.

[11] Patent Number: 4,789,096
[45] Date of Patent: Dec. 6, 1988

[54] METHOD OF SOLDERING JOINTS BY MOVING THEM THROUGH A TARGET AREA ON WHICH A STREAM OF HOT GAS IS FOCUSED

[75] Inventors: Gerald R. Dunn, Carlsbad; Kenneth W. Economy, San Marcos; Thomas A. Snodgrass, Carlsbad, all of Calif.

[73] Assignee: Unisys Corporation, Detroit, Mich.

[21] Appl. No.: 45,086

[22] Filed: May 4, 1987

[51] Int. Cl.[4] .............................................. B23K 31/02
[52] U.S. Cl. ................................ 228/179; 228/108.2; 228/240; 228/242
[58] Field of Search ...................... 228/179, 180.2, 240, 228/242, 219

[56] References Cited

U.S. PATENT DOCUMENTS

| | | | |
|---|---|---|---|
| 3,516,155 | 6/1970 | Smith | 228/180.2 X |
| 4,311,267 | 1/1982 | Lim | 228/180.2 |
| 4,504,008 | 3/1985 | Kent et al. | 228/180.2 |
| 4,505,035 | 3/1985 | Burton et al. | 228/180.2 X |
| 4,653,682 | 3/1987 | Dines et al. | 228/180.2 |

FOREIGN PATENT DOCUMENTS 2910066 9/1980 Fed. Rep. of Germany ...... 228/242

*Primary Examiner*—Fred A. Silverberg
*Assistant Examiner*—Carmine Cuda
*Attorney, Agent, or Firm*—Charles J. Fassbender; L. Joseph Marhoefer

[57] ABSTRACT

A method of soldering component leads to I/O pads on a printed circuit board, without desoldering any other circuit components which were previously soldered to the board near the pads, includes the steps of: forming a mechanical assembly in which respective joints of the pads and the leads and respective solder mounds are mechanically held together; moving the assembly at a predetermined speed on a conveyor such that the joints, but not the previously soldered components, sequentially pass through a target area which is small relative to the total number of joints; and melting and then hardening the solder mounds, without desoldering the previously soldered components, by directing a focused stream of hot gas at the target area as the joints move therethrough on the conveyor.

7 Claims, 4 Drawing Sheets

METHOD OF SOLDERING JOINTS BY MOVING THEM THROUGH A TARGET AREA ON WHICH A STREAM OF HOT GAS IS FOCUSED

BACKGROUND OF THE INVENTION

This invention relates to soldering processes; and more particularly, it relates to processes for soldering component leads to I/O (input/output) pads on printed circuit boards which are populated with other electrical components that are already soldered to the board.

In the prior art, one conventional process by which components were soldered to a circuit board included the steps of—providing the board with via holes which corresponded in position and number to all of the I/O leads on the components which were to be soldered to the board, placing all of the components on one side of the board such that their leads went through the via holes, and passing the opposite side of the board through a solder wave. This method, however, is not suitable for fabricating more fully populated printed circuit boards in which components are soldered to both of the boards' surfaces.

Other processes which are called "infrared reflow" or "vapor phase reflow" are used to solder components to both sides of a circuit board. With either of these processes, the leads of the various components or the I/O pads on the boards to which the leads are to be attached are provided with solder paste; all of the components are positioned on the board and held in place mechanically; and the entire assembly is placed in an infrared oven or gas vapor. There, the solder paste melts; and it subsequently hardens after the assembly is removed from the oven or gas vapor.

However, in certain situations it is desirable to not solder all of the components to the board at the same time. For example, if some of the components are very expensive (such as I/O connectors which may cost several hundred dollars), it may be desirable to put those components on the board last. That enables the remainder of the board to be fabricated and tested. Then, if the test detects a nonrepairable fault, the partially populated board can be scrapped without wasting any of the expensive components.

To partially populate a board with circuit components, solder them place, and thereafter fully populate the board and resolder it, infrared reflow and vapor phase reflow can be used. However, when the board is fully populated and put in the infrared oven or gas vapor, the solder in the joints of all of the components which were previously soldered to the board will melt for a second time. When a soldered joint is reflowed, some of the solder will migrate away from the joint; and if this migration becomes too large, an open circuit of the joint can result. Thus, reflowing previously soldered joints will result in reliability problems.

One way to complete the fabrication of a partially populated board would be to solder the remaining components by hand. However, that method being labor intensive, is expensive, slow, and subject to human error. Further, for certain types of components, the terminals that are to be soldered are partially hidden from view.

One other prior art method of completing the board's fabrication would be to provide respective nozzles that have the same shape as the components which remain to be soldered, sequentially place each nozzle over its corresponding component, and force hot gas through the nozzle when it is in place. However, such a method is undesirable because differently shaped nozzles are needed for each differently shaped component; and stocking and changing the nozzles for each component shape is both time-consuming and expensive. Further, the above method requires some mechanism by which the circuit board or nozzle is manually moved under a microscope in seven different directions (i.e., left and right, backward and forward, up and down, and also rotation) in order to align the nozzle over a component on a circuit board, and getting a precise alignment in all seven directions is very tedious. Also, the hot gas from a nozzle which has the same shape as a circuit component and which is placed over that component will heat up the component itself. And this heat can damage the component, or it can destroy certain seals such as a lid seal, or it can melt various adhesives such as a heat sink attach adhesive.

Accordingly, a primary object of the invention is to provide a soldering method in which all of the above problems are avoided.

BRIEF SUMMARY OF THE INVENTION

With the present invention, the above object is achieved by a method which includes the steps of:

forming a mechanical assembly in which respective joints of I/O pads on a printed circuit board, interconnect leads from circuit components, and solder mounds are mechanically held together;

moving the assembly at a predetermined speed on a conveyor such that the above joints, but not any other previously soldered circuit components on the printed circuit board, sequentially pass through a target area which is small relative to the total number of joints; and melting and then hardening the solder mounds, without desoldering the previously soldered circuit components, by directing a focused stream of hot gas at the target area as the joints move therethrough on the conveyor.

This method is particularly useful where the pads on the printed circuit board are disposed in two parallel rows and the leads to the pads of one of the rows overlie and partially shield the solder mounds for the pads of the other row, because the stream of hot gas will still hit and melt such partially shielded solder mounds.

Also, this method is also particularly useful where the leads extend from the components to the pads in sets of different numbers because all such different sets of leads can be soldered with just one shape for the hot gas target area.

Preferably, the stream of hot gas is directed to the target area at an angle of 30° to 80° with respect to the plane of the circuit board so that a majority of the hot gas which collides with the joint deflects away from the previously soldered circuit components.

BRIEF DESCRIPTION OF THE DRAWINGS

Various aspects of the invention are described in the Detailed Description in conjunction with the accompanying drawings wherein.

DETAILED DESCRIPTION OF THE INVENTION

Figure 1:
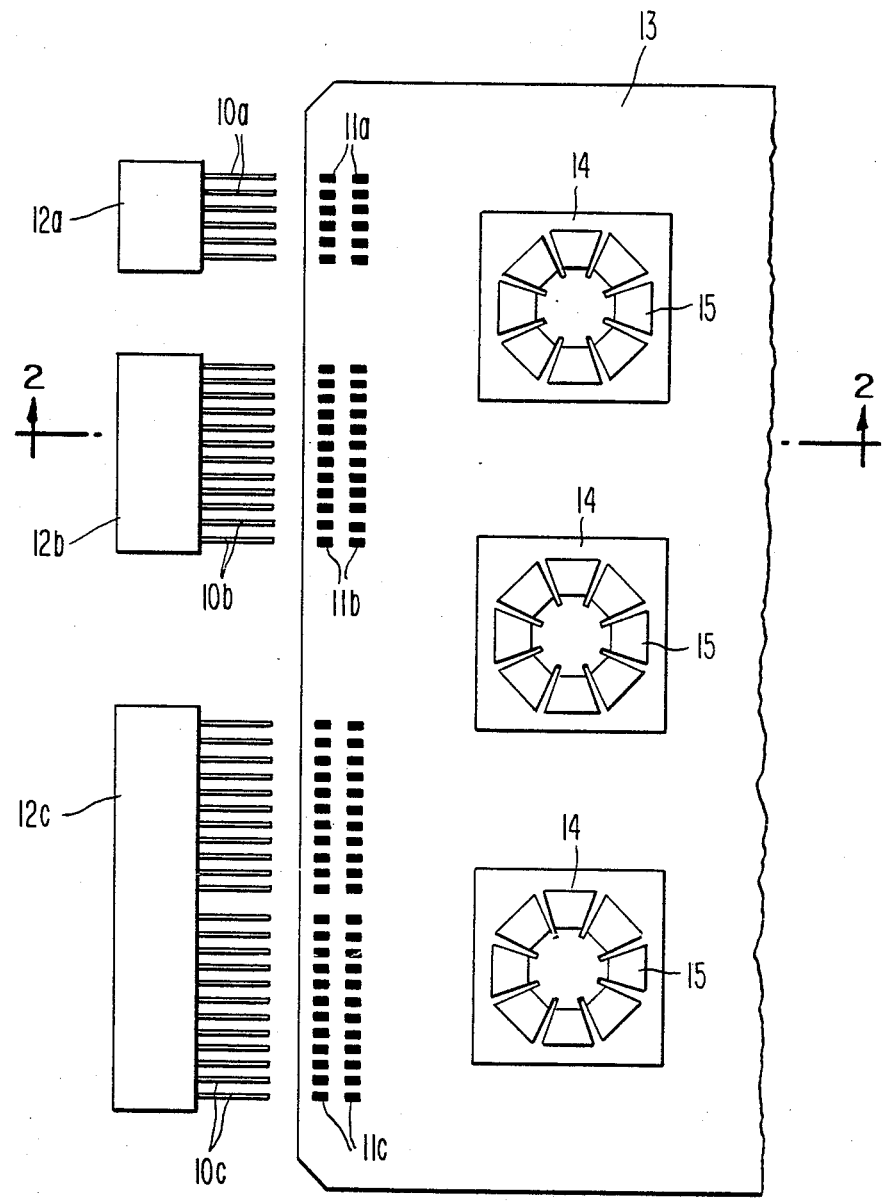
FIG. 1 is a plane view of I/O pads on a printed circuit board and leads of a connector which are to be soldered to the I/O pads in accordance with the invention.

Referring now to the figures, a preferred method of soldering component leads to I/O pads in accordance with the invention will be described in detail. Beginning with FIGS. 1 and 2, reference numerals 10a, 10b, and 10c indicate three sets of leads, and reference numerals 11a, 11b, 11c indicate three corresponding sets of I/O pads. Leads 10a, 10b, and 10c extend in a cantilevered fashion from respective connector frames 12a, 12b, and 12c; and all of the I/O pads are disposed on a printed circuit board 13. Various circuit components, such as pin grid array packages 14 with heat sinks 15 and surface mounted packages 16, are already soldered onto the printed circuit board, and they are electrically interconnected to each other and to the I/O pads via conductors (not shown) in the circuit board.

Figure 2:
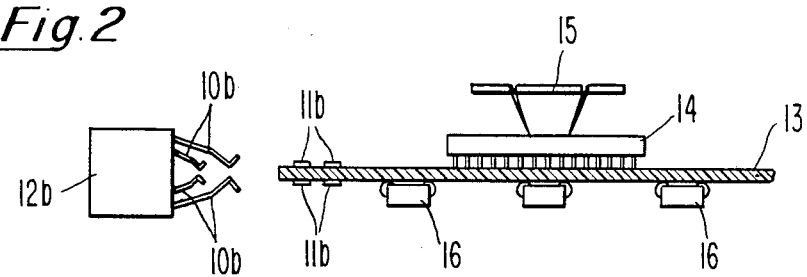
FIG. 2 is a sectional view taken along lines 2—2 in FIG. 1.

In FIG. 1, the number of leads 10a, 10b, and 10c are all different. There are twenty-four leads in set 10a, forty-eight leads in set 10b, and ninety-two leads in set 10c. Half of the leads in each set 10a, 10b, and 10c are bent downward so that they can contact I/O pads on the upward-facing surface of board 13, and the remaining leads are bent upward so that they can contact I/O pads on the downward-facing surface of board 13. Also, all of the downward-bent leads are arranged to contact I/O pads in two parallel rows, and the leads which contact the row of I/O pads which is furthest from the connector body hide or shield the leads which contact the other row of I/O pads. All of the upward-bent leads are arranged in a similar fashion. As an example, the I/O pads are thirty mils by sixty mils; their centers within a row are fifty mils apart; and their centers between adjacent rows are two hundred mils apart.

Figure 3:
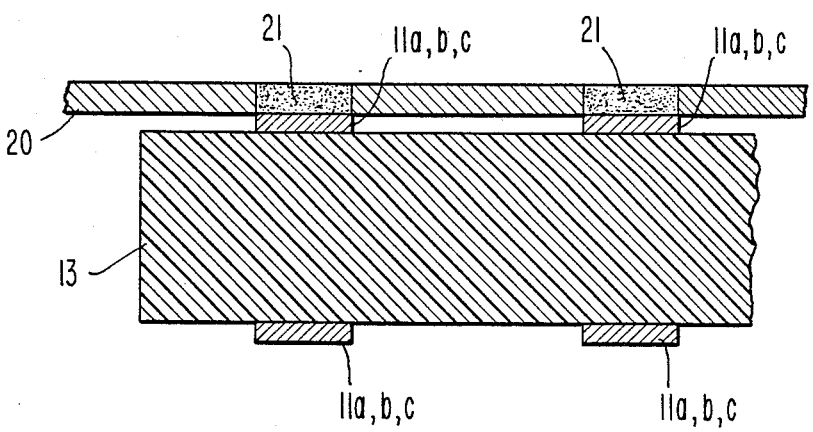
FIGS. 3, 4, 5, 6, 7, and 8 illustrate respective steps of a preferred process according to the invention by which the I/O pads and leads of FIGS. 1 and 2 are soldered together.
Figure 4:
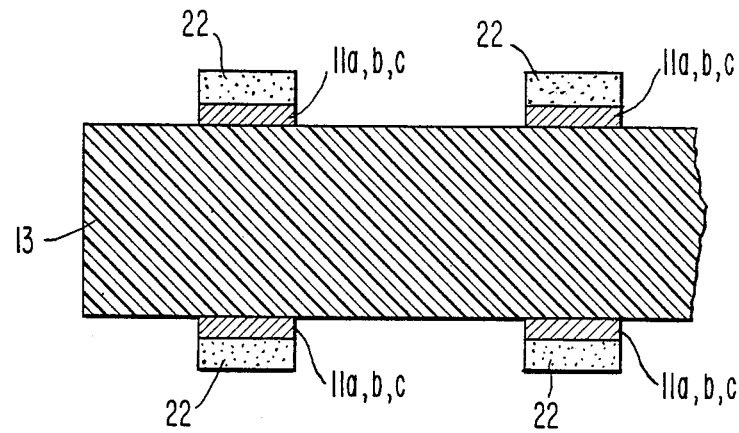

Turning now to FIGS. 3 and 4, the initial steps by which are above leads are attached to their corresponding I/O pads will be described. As FIG. 3 shows, a stencil mask 20 is placed over one surface of board 13. This mask 20 has a plurality of holes which correspond in number and location to the I/O pads 11a, 11b, and 11c. After these holes are aligned with the I/0 pads, a solder paste 21 is pressed by hand into the holes via a soft sponge. As an example, the solder paste is 62% tin, 36% lead and 2% silver which melts at 370° F., and the thickness of the stencil mask 20 is ten mils. Thereafter, the stencil mask 20 is lifted off of the printed circuit board 13, and this leaves respective mounds of solder paste 21 on the I/O pads. Subsequently, the paste mounds are partially cured by heating them to a temperature of 160° F. for approximately thirty minutes. This makes the resulting mounds 22 more rigid, attaches them more firmly to the I/O pads, and thus makes the mounds less susceptible to damage during later processing steps. Also, since the solder does not melt, the upper surface of the mounds remains flat; so the leads will not slip off of them during the steps of FIGS. 5 and 6.

Figure 5:
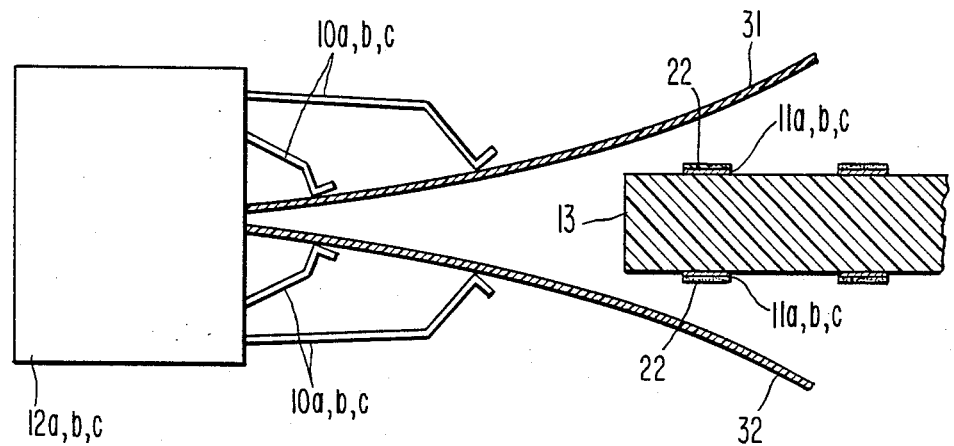
Figure 6:
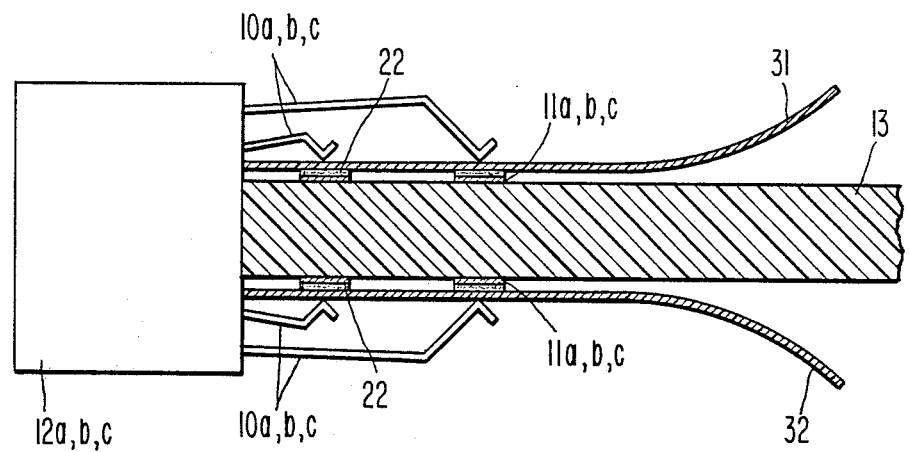

After the above steps are repeated on th oppositely facing surface of the printed circuit board, the steps of FIGS. 5 and 6 are carried out. First, as shown in FIG. 5, a pair of thin smooth sheets 31 and 32 are inserted between the downward-bent and upward-bent leads. As an example, these sheets are three mill thick transparent sheets of mylar. Thereafter, the edges of these sheets which are furthest from the connector body are spread apart, and the region of the printed circuit board which has the I/O pads and solder mounds is inserted between the sheets. By this means, the printed circuit board can be slid between the downward-bent and upward-bent leads and the solder mounds can be aligned with those leads without either damaging the leads or damaging the solder mounds. After this alignment is complete, the sheets 31 and 32 are simply pulled out from under the leads, whereupon the leads spring back and come to rest on the solder mounds.

Figure 7:
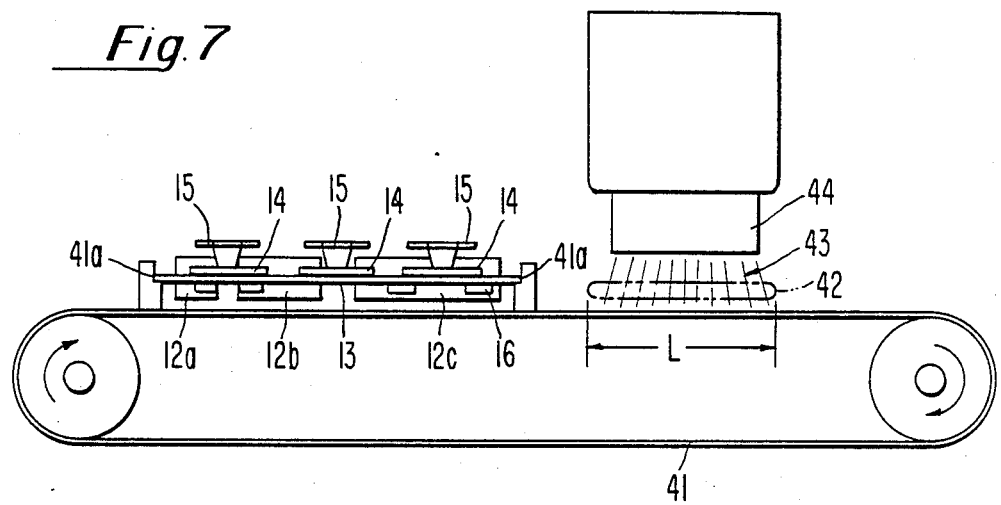
Figure 8:
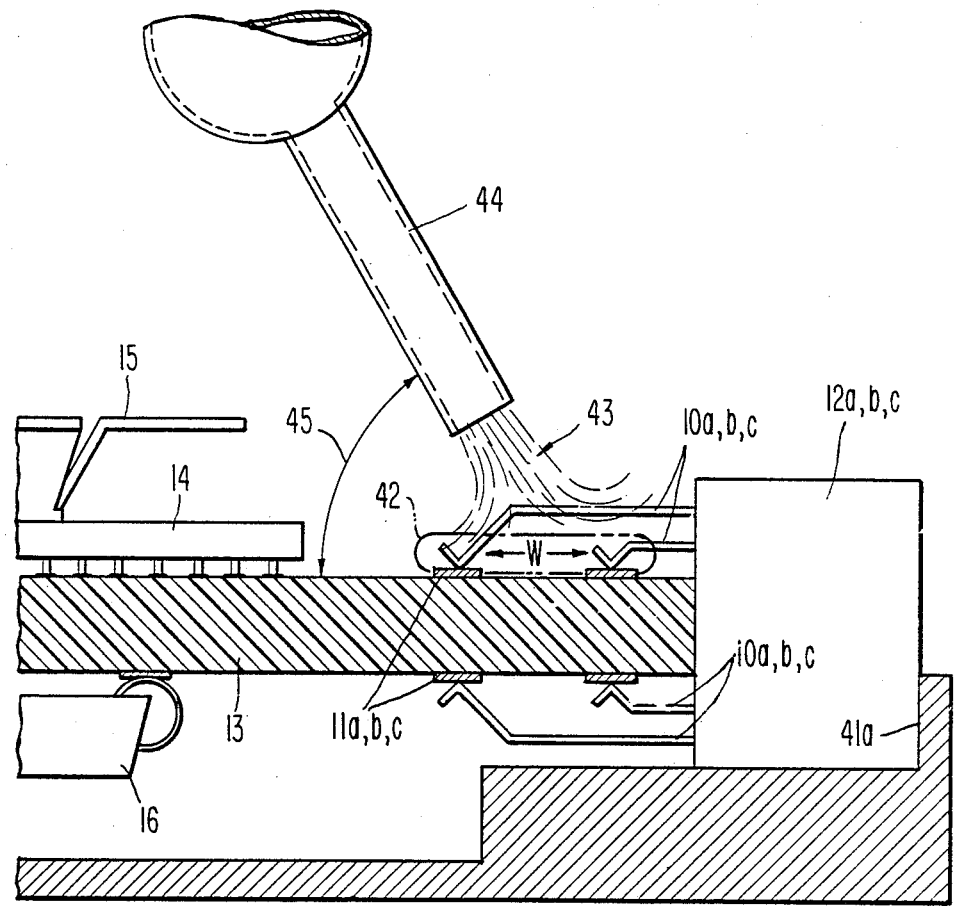

Utilizing the above mechanical assembly, the final steps of the process are carried out as is illustrated in FIGS. 7 and 8. There, are assembly is placed on a conveyor 41 and the connectors are butted against a surface 41a for alignment. This conveyor then moves the assembly in just one direction such that the joints of the solder mounds, I/O pads, and leads sequentially pass through a target area 42 for a stream of hot gas 43 which is focused onto the target area by a nozzle 44. As the joints pass through this target area 42, the hot gas 43 melts the solder mounds. This solder then rehardens as it leaves the target area and thereby permanently holds the joint together. After the joints on one side of the board pass through the hot gas, the board 13 is flipped over and the steps of FIGS. 7 and 8 are repeated.

Preferably, the temperature of the gas in the target area is at least 100° F. above the melting point of the solder mounds, and the joints move through the gas so fast that they are heated to just above the melting point. In the above described case where the melting point of the solder mounds is 370° F., a preferred temperature for the gas in the target area is 600° F. Other preferred parameters are a gas flow rate of 8 SCFM; a distance of 150 mils between the end of the nozzle and the joint; a target area length L of 0.1 inch width W of 2 inches; and a conveyor speed of 25 inches/minute. Also, by focusing the hot gas on the joint in a small target area, and by directing the gas at the joint at an angle 45 which is from 30° to 8° with respect to the circuit board, none of the previously soldered components are desoldered.

A preferred process for soldering component leads to I/O pads on a printed circuit board has now been described in detail. In addition, however, many changes and modifications can be made to these details without departing from the nature and spirit of the invention. For example, any type of clamp may be added to the assembly of FIG. 6 to help insure that the parts of the joints don't move apart as they are processed via the steps of FIGS. 7 and 8. Also, the above gas temperature, gas flow rate, conveyor speed, distance of nozzle tip from target, and size of target area can all be adjusted somewhat to accommodate a variety of solders which have different melting points for the solder mounds. Accordingly, it is to be understood that the invention is not limited to the above details but is defined by the appended claims.

What is claimed is:

1. A method of soldering a number of component leads to a corresponding number of I/O pads along an edge of a printed circuit board, without desoldering any circuit components which were previously soldered to said board near said pads, said method including the steps of:

forming a mechanical assembly in which respective joints of said pads and said leads and respective solder mounds are mechanically held together;

moving said assembly at a predetermined speed on a conveyor such that said joints, but not said previously soldered components, sequentially pass through a target area which is small relative to the total number of joints; and melting and then hardening said solder mounds, without desoldering said circuit components, by directing a focused stream of hot gas at said target area as said joints move therethrough on said conveyor;

said hot gas stream forming an angle with respect to both the plane of said circuit board and said board edge such that a majority of the gas which collides with said joint is deflected off of the edge of said printed circuit board and away from said previously soldered components.

2. A method according to claim 1 and further including the substeps of disposing said pads on said printed circuit board in two parallel rows, contacting said pads of one row with a bottom set of leads and solder mounds, shielding from view said bottom set of leads and solder mounds with a top set of leads which contact the second row of pads, and melting said bottom set of solder mounds by enveloping said top set of leads with said stream of hot gas.

3. A method according to claim 1 wherein some of said leads are upward-facing and the remainder are downward-facing, and wherein said mechanical assembly is formed by the substeps of inserting a pair of thin smooth sheets between said upward-facing and downward-facing leads, sliding said board between said sheets until said pads align with said leads, and pulling said sheets out from between said pads and said leads.

4. A method according to claim 3 wherein said sheets are transparent and wherein said alignment in said sliding step is performed visually through said sheets.

5. A method according to claim 4 and further including the substeps of squeezing a solder paste through a plurality of template holes which are aligned with said I/O pads, and partially curing said paste on said I/O pads prior to forming joints with said leads.

6. An assembly comprising a printed circuit board, a plurality of circuit components that are initially soldered to said printed circuit board, and a number of connector leads which are subsequently soldered to a corresponding number of I/O pads along an edge of said printed circuit board near said initially soldered components, said assembly being fabricated by the steps of:

forming and mechanically holding together, respective joints of said pads and said leads and respective solder mounds;

moving said joints at a predetermined speed on a conveyor such that they sequentially pass through a target area which is small relative to the total number of joints; and melting and then hardening said solder mounds by directing a focused stream of hot gas at said target area as said joints move therethrough on said conveyor;

said hot gas stream forming an angle with respect to both the plane of said circuit board and said board edge such that a majority of the gas which collides with said joint is deflected off of the edge of said printed circuit board and away from said initially soldered components.

7. An assembly according to claim 6 which is fabricated by the substeps of disposing said pads on said printed circuit board in two parallel rows, contacting said pads of one row with a bottom set of leads and solder mounds, shielding said bottom set of leads and solder mounds with a top set of leads which contact the second row of pads, and melting said bottom set of solder mounds by enveloping said top set of leads with said stream of hot gas.

* * * * *